(12) United States Patent
Jung et al.

(10) Patent No.: US 7,829,953 B2
(45) Date of Patent: Nov. 9, 2010

(54) SEMICONDUCTOR DEVICE AND METHOD OF FABRICATING THE SAME

(75) Inventors: Hyung Suk Jung, Suwon-si (KR); Jong-Ho Lee, Suwon-si (KR); Sung Kee Han, Seongnam-si (KR); Ha Jin Lim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 218 days.

(21) Appl. No.: 11/966,640

(22) Filed: Dec. 28, 2007

(65) Prior Publication Data

US 2008/0150036 A1    Jun. 26, 2008

Related U.S. Application Data

(63) Continuation-in-part of application No. 11/550,602, filed on Oct. 18, 2006, now abandoned.

(30) Foreign Application Priority Data

Jan. 2, 2007    (KR)    ........... 10-2007-0000279

(51) Int. Cl.
    *H01L 29/72* (2006.01)
(52) U.S. Cl. .............. 257/369; 257/69; 257/365; 257/401; 257/411
(58) Field of Classification Search ........... 257/69, 257/365, 369, 401, 411
    See application file for complete search history.

(56) References Cited

U.S. PATENT DOCUMENTS

| 6,696,345 B2 * | 2/2004 | Chau et al. ........... 438/387 |
| 6,790,719 B1 | 9/2004 | Adetutu |
| 6,794,234 B2 | 9/2004 | Polishchuk et al. |
| 7,019,351 B2 | 3/2006 | Eppich |
| 2004/0023478 A1 | 2/2004 | Samavedam et al. |
| 2005/0250258 A1 | 11/2005 | Metz et al. |
| 2008/0029821 A1 * | 2/2008 | Yamagami et al. ........ 257/365 |
| 2008/0157212 A1 * | 7/2008 | Lavoie et al. ........... 257/369 |

FOREIGN PATENT DOCUMENTS

| DE | 10323013 A1 | 11/2003 |
| KR | 1020020080111 | 10/2002 |
| KR | 1020060083337 | 7/2006 |

OTHER PUBLICATIONS

U.S. Patent Application Publication US2003/0203560 A1 corresponds and serves as the English translation for Foreign Reference DE103 23 013 A1.
English Abstract Publication No. 1020060083337.
English Abstract Publication No. 1020020080111.

* cited by examiner

*Primary Examiner*—Edward Wojciechowicz
(74) *Attorney, Agent, or Firm*—F. Chau & Associates, LLC

(57) ABSTRACT

A semiconductor device includes a semiconductor substrate including an NMOS region and a PMOS region, a gate insulating layer formed on the semiconductor substrate, an NMOS gate formed on the gate insulating layer of the NMOS region, and a PMOS gate formed on the gate insulating layer of the PMOS region. Any one of the NMOS gate and the PMOS gate includes a one-layered conductive layer pattern, and another of the NMOS gate and the PMOS gate includes a three-layered conductive layer pattern.

11 Claims, 7 Drawing Sheets

SEMICONDUCTOR DEVICE AND METHOD OF FABRICATING THE SAME

CROSS REFERENCE TO RELATED APPLICATION

This application is a continuation-in-part (CIP) of U.S. patent application Ser. No. 11/550,602, filed on Oct. 18, 2006 now abandoned, which claims priority from Korean Patent Application No. 10-2006-0009367, filed on Jan. 31, 2006, the disclosures of which are each hereby incorporated by reference herein in their entirety. In addition, the present application also claims priority from Korean Patent Application No. 10-2007-0000279 filed on Jan. 2, 2007, the disclosure of which is hereby incorporated by reference herein in its entirety.

BACKGROUND OF THE INVENTION

1. Technical Field

The present disclosure relates to a semiconductor device and to a method of fabricating the same and, more particularly, to a semiconductor device that includes a dual gate and a method of fabricating the same.

2. Description of the Related Art

With regard to semiconductor devices, the recent trend has been toward higher performance and higher speed. In particular, in the case of a semiconductor device that include both an n-channel metal-oxide semiconductor (NMOS) transistor and a p-channel metal-oxide semiconductor (PMOS) transistor, efforts have been made to optimize the performance of the transistor according to the respective transistor type.

The above-mentioned efforts include changing the structures of gates of the NMOS transistor and the PMOS transistor or using a high-k dielectric layer that has dielectricity higher than that of a silicon oxide layer as a gate insulating layer, thereby making technological progress.

For example, in the case where the gate includes a polysilicon layer, to avoid the gate depletion, the gate has an MIPS (metal-inserted polysilicon) structure. However, with the gate that has the MIPS structure, the work function may be changed due to the inserted metal layer, and thus as a result, the threshold voltage Vth may be changed. Consequently, difficulties may result in that physical properties of the semiconductor device may be reduced.

Meanwhile, in the case where the gate including the metal layer instead of the polysilicon layer is used, the depletion of the gate may be prevented. However, in the case of metal, it may be very difficult to control the work function due to impurities unlike with the polysilicon layer. Accordingly, in the case where metal having a single work function is used, it may be difficult to desirably control the threshold voltage of the NMOS transistor and the PMOS transistor. In addition, in the case where the NMOS and the PMOS are formed of metals having different work functions, it may be difficult to perform the integration.

SUMMARY OF THE INVENTION

Exemplary embodiments of the present invention provide a semiconductor device that includes a dual gate having a desirable work function to improve electric properties.

Exemplary embodiments of the present invention provide a method of fabricating the semiconductor device.

In accordance with an exemplary embodiment of the present invention, a semiconductor device is provided. The semiconductor device includes a semiconductor substrate including an n-channel metal-oxide semiconductor (NMOS) region and a p-channel metal-oxide semiconductor (PMOS) region, a gate insulating layer formed on the semiconductor substrate, an n-channel metal-oxide semiconductor (NMOS) gate formed on the gate insulating layer of the NMOS region and including a three-layered conductive layer pattern, and a p-channel metal-oxide semiconductor (PMOS) gate formed on the gate insulating layer of the PMOS region and including a one-layered conductive layer pattern.

In accordance with another exemplary embodiment of the present invention, a method of fabricating a semiconductor device is provided. The method includes forming a gate insulating layer on a semiconductor substrate including an n-channel metal-oxide semiconductor (NMOS) region and a p-channel metal-oxide semiconductor (PMOS) region, forming a first conductive layer, a work function control layer, and a second conductive layer on the gate insulating layer, forming a photoresist pattern on the second conductive layer so as to expose the PMOS region, and selectively removing the second conductive layer and the work function control layer formed on the PMOS region. The method further includes removing the photoresist pattern, forming a conductive layer for a gate electrode on an entire surface of the substrate, and performing patterning to form a p-channel metal-oxide semiconductor gate (PMOS) gate including a one-layered conductive layer pattern in the PMOS region and an n-channel metal-oxide semiconductor (NMOS) gate including a three-layered conductive layer pattern in the NMOS region.

In accordance with an exemplary embodiment of the present invention, a semiconductor device is provided. The semiconductor device includes a semiconductor substrate including an n-channel metal-oxide semiconductor (NMOS) region and a p-channel metal-oxide semiconductor (PMOS) region, a gate insulating layer formed on the semiconductor substrate and an n-channel metal-oxide semiconductor (NMOS) gate formed on the gate insulating layer of the NMOS region and includes a one-layered conductive layer pattern. The semiconductor device further includes a p-channel metal oxide semiconductor (PMOS) gate formed on the gate insulating layer of the PMOS region and includes a three-layered conductive layer pattern.

In accordance with another exemplary embodiment, a method of fabricating a semiconductor device is provided. The method includes forming a gate insulating layer on a semiconductor substrate including an n-channel metal-oxide semiconductor (NMOS) region and a p-channel metal-oxide semiconductor (PMOS) region, forming a first conductive layer, a work function control layer, and a second conductive layer on the gate insulating layer, forming a photoresist pattern on the second conductive layer so as to expose the NMOS region and selectively removing the second conductive layer and the work function control layer formed on the NMOS region. The method further includes removing the photoresist pattern, forming a conductive layer for a gate electrode on an entire surface of the substrate and performing patterning to form a p-channel metal-oxide semiconductor (PMOS) gate including a three-layered conductive layer pattern in the PMOS region and an n-channel metal-oxide semiconductor (NMOS) gate including a one-layered conductive layer pattern in the NMOS region.

BRIEF DESCRIPTION OF THE DRAWINGS

Exemplary embodiments of the present invention can be understood in more detail from the following description when taken in conjunction with to the attached drawings in which.

DETAILED DESCRIPTION OF THE EXEMPLARY EMBODIMENTS OF THE INVENTION

Figure 1:
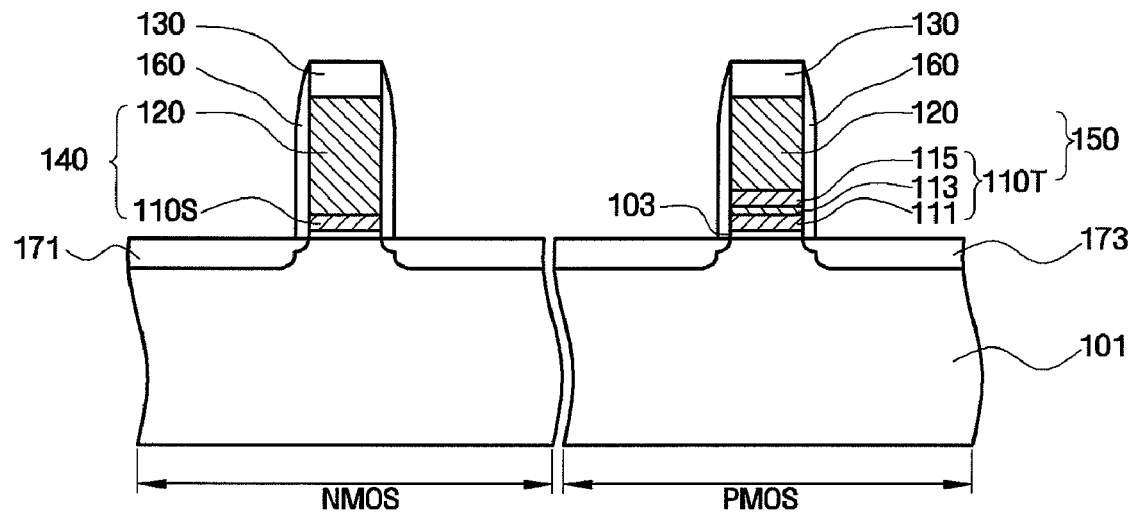
FIG. 1 is a sectional view of a semiconductor device according to an exemplary embodiment of the present invention.

The present invention may, however, be embodied in many different forms and should not be construed as being limited to the exemplary embodiments set forth herein. Like reference numerals refer to like elements throughout the specification.

The present invention will be described with reference to cross-sectional views and/or plan views, in which exemplary embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in the manufacturing processes. For example, while an etched region is shown in a rectangular shape, it may be rounded or have a predetermined curvature. Thus, regions shown in the drawings are illustrated in schematic form and the shapes of the regions are presented simply by way of illustration and not as a limitation.

Further, "one film is provided on another film or a semiconductor substrate", or "one film is in contact with another film or a semiconductor substrate" means that the one film may be in direct contact with another film or the semiconductor substrate or still another film may be interposed between the one film and another film or the semiconductor substrate.

A semiconductor device according to an exemplary embodiment of the present invention will be described with reference to FIG. 1 hereinafter. FIG. 1 is a sectional view of the semiconductor device according to the exemplary embodiment of the present invention.

With reference to FIG. 1, the semiconductor device according to the exemplary embodiment of the present invention includes a semiconductor substrate 101 having an NMOS region and a PMOS region.

Illustrative, but non-limiting examples of the semiconductor substrate 101 may include a substrate made of one or more semiconductor materials selected from the group consisting of silicon (Si), germanium (Ge), silicon-germanium (SiGe), gallium phosphide (GaP), gallium arsenide (GaAs), silicon carbide (SiC), silicon-germanium-carbon (SiGeC), indium arsenide (InAs), and indium phosphide (InP) and an SOI (Silicon On Insulator) substrate.

A gate insulating layer 103 is formed on the semiconductor substrate 101. In connection with this, examples of the gate insulating layer 103 may include but are not limited to a silicon oxide layer or a high dielectric layer. The high dielectric layer means the layer that is made of the material having dielectricity higher than that of the silicon oxide layer, for example, the material having a dielectric constant of about 10 or more. Examples of the high dielectric layer may include but are not limited to an oxide layer, an aluminate layer, or a silicate layer that includes at least one of the metals such as hafnium (Hf), zirconium (Zr), aluminum (Al), titanium (Ti), lanthanum (La), yttrium (Y), gadolinium (Gd), and tantalum (Ta).

In addition, the thickness of the gate insulating layer 103 may be about 10 to about 60 angstroms (Å). Needless to say, the type or the thickness of the gate insulating layer 103 may be controlled to a desirable range in the present invention.

Also, a predetermined interface layer may be further interposed between the semiconductor substrate 101 and the gate insulating layer 103 that is made of the high dielectric material in the case of when the high dielectric layer is formed on the semiconductor substrate 101 as the gate insulating layer 103. The interface layer may prevent the reaction between the semiconductor substrate 101 and the gate insulating layer 103.

An n-channel metal-oxide semiconductor (NMOS) gate 140 and a p-channel metal-oxide semiconductor (PMOS) gate 150 are formed in the NMOS region and the PMOS region, respectively, on the gate insulating layer 103.

The NMOS gate 140 may be formed on the gate insulating layer 103 of the NMOS region, and may include, for example, a one-layered conductive layer pattern 10S and a conductive layer pattern for gate electrodes 120 on the one-layered conductive layer pattern.

In connection with this, the one-layered conductive layer pattern 110S may be formed of a first conductive layer pattern and have a work function of about 4.0 to about 4.4 eV, which is a beneficial work function of the NMOS gate 140. Examples of the one-layered conductive layer pattern 110S may include but are not limited to a single layer pattern of tungsten (W), molybdenum (Mo), titanium (Ti), tantalum (Ta), aluminum (Al), hafnium (Hf), and zirconium (Zr), a nitride layer pattern thereof, and a nitride layer pattern of W, Mo, Ti, Ta, Hf, and Zr which is doped with Al or Si. Threshold voltage of the NMOS gate 140 may be reduced as the thickness of the one-layered conductive layer pattern 110S is reduced. Meanwhile, beneficial gate properties of the NMOS gate 140 relate to the intensity of the threshold voltage of the NMOS gate 140. In the exemplary embodiments of the present invention, it is preferable that the threshold voltage of the NMOS gate 140 be small. Accordingly, the thin one-layered conductive layer pattern 110S may ensure the beneficial work function of the NMOS gate 140. In consideration of the above-description, the thickness of the one-layered conductive layer pattern 110S may be, for example, in the range about 10 to about 60 Å.

The conductive layer pattern for gate electrodes 120 is provided on the one-layered conductive layer pattern 110S, and the conductive layer pattern for gate electrodes 120 may be formed of a conductive silicon layer, a metal layer, a conductive metal oxide layer, a conductive metal nitride layer, or a metal silicide layer. The conductive silicon layer is, for example, a polysilicon layer to which boron (B), phosphorus (P), arsenic (As), indium (In), or a mixture thereof is added, and the metal layer may be made of, for example, tungsten (W), molybdenum (Mo), titanium (Ti), tantalum (Ta), aluminum (Al), hafnium (Hf), zirconium (Zr), platinum (Pt), ruthenium (Ru), Rd, nickel (Ni), cobalt (Co), or a mixture thereof. In addition, the conductive metal oxide layer is formed by combining the metal layer and oxygen, and the conductive metal nitride layer is formed by combining the metal layer and nitrogen. Furthermore, the metal silicide layer may be formed by combining the metal layer and silicon. A mask pattern 130 may be further formed on an upper side of the conductive layer pattern for gate electrodes 120.

Meanwhile, a PMOS gate 150 may be formed on the gate insulating layer 103 of the PMOS region, and include a three-layered conductive layer pattern 110T and the conductive layer pattern for gate electrodes 120 on the conductive layer pattern 110T.

In connection with this, the three-layered conductive layer pattern 110T includes a first conductive layer pattern 111 and a second conductive layer pattern 115, and a first work function control layer pattern 113 may be interposed between the first conductive layer pattern 111 and the second conductive layer pattern 115. The three-layered conductive layer pattern 110T may have a work function of about 4.8 to about 5.1 eV which is suitable for the PMOS gate 150. For example, the three-layered conductive layer pattern 110T is formed to be thicker than the one-layered conductive layer pattern 110S, and the first work function control layer pattern 113 that is interposed between the first conductive layer pattern 111 and the second conductive layer pattern 115 may function to increase the threshold voltage of the PMOS gate 150. Accordingly, the PMOS region may have a work function higher than that of the NMOS.

The first conductive layer pattern 111 and the second conductive layer pattern 115 may be made of the same material as the first conductive layer pattern 111. Furthermore, the first work function control layer pattern 113 may be formed of a silicon oxide layer, a silicon nitride layer, a metal layer including at least one selected from the group consisting of aluminum and yttrium, an oxide layer thereof, a nitride layer thereof, or an oxynitride layer thereof.

In connection with this, the first conductive layer pattern 111 and the first work function control layer pattern 113 may be made of materials having different etching selectivities. Furthermore, in view of the fabrication process, the second conductive layer pattern 115 be made of the material having an etching selectivity similar to the first work function control layer pattern 113. However, the second conductive layer pattern 115 may be made of the material having the etching selectivity different from the first work function control layer pattern 113.

In consideration of the work function of the PMOS region, the three-layered conductive layer pattern 110T may have the thickness in the range of about 50 to about 200 Å, and the first work function control layer pattern 113 may have the thickness in the range of about 1 to about 30 Å. In consideration of the work function of the NMOS region and the PMOS region, the three-layered conductive layer pattern 110T may be formed to be thicker than the one-layered conductive layer pattern 110S.

Spacers 160 may be formed on the walls of the gates 140 and 150, and source and drain regions 171 and 173 are disposed to be adjacent to the gates 140 and 150 in the semiconductor substrate.

As described above, the semiconductor device according to an exemplary embodiment of the present invention includes the single-layered or three-layered conductive layer pattern under the gate so that the gate having the desirable work function is provided in the NMOS region and the PMOS region. Thereby, the absolute values of the threshold voltages of the NMOS and the PMOS may be maintained to be the same as each other. Thus, the properties of the semiconductor device may be improved.

Figure 2:
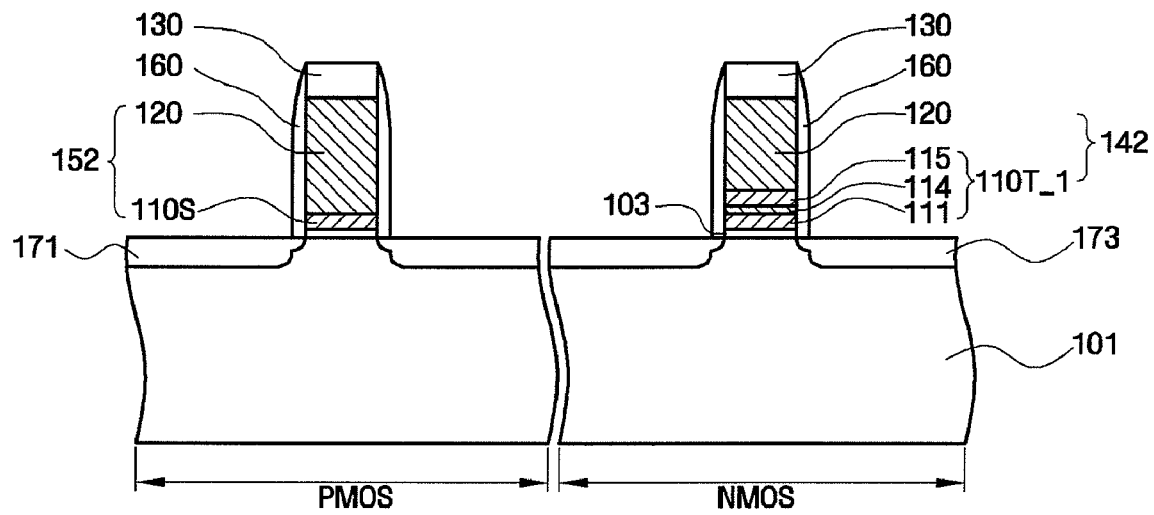
FIG. 2 is a sectional view of a semiconductor device according to an exemplary embodiment of the present invention.

FIG. 2 is a sectional view of a semiconductor device according to another exemplary embodiment of the present invention.

With reference to FIG. 2, the semiconductor device according to another exemplary embodiment of the present invention is different from that of the embodiment of FIG. 1 in that the one-layered conductive layer pattern 110S is formed in the PMOS region, a three-layered conductive layer pattern 110T_1 is formed in the NMOS region, and the three-layered conductive layer pattern 110T_1 includes a second work function control layer pattern 114 made of a lanthanum-based material.

For example, the one-layered conductive layer pattern 110S of the PMOS region may be formed of the first conductive layer pattern made of the same material as that of FIG. 1. The one-layered conductive layer pattern 110S may have the work function of about 4.8 to about 5.1 eV which is a beneficial work function of the PMOS gate 152. In the PMOS region, the threshold voltage of the PMOS gate 152 is reduced as the thickness of the one-layered conductive layer pattern 110S is increased. Accordingly, to obtain beneficial gate properties of the PMOS gate 152, the thickness of the one-layered conductive layer pattern 110S of the present embodiment may be larger than that of the one-layered conductive layer pattern 110S of the NMOS region of FIG. 1.

The three-layered conductive layer pattern 110T' may include, for example, the first conductive layer pattern 111, the second conductive layer pattern 115, and a second work function control layer pattern 114 that is interposed between the first conductive layer pattern 111 and the second conductive layer pattern 115. The second work function control layer pattern 114 may be formed of a metal layer made of, for example, only a lanthanum-based material such as cerium (Ce), praseodymium (Pr), neodymium (Nd), gadolinium (Gd), terbium (Tb), dysprosium (Dy), erbium (Er), and europium (Eu), an oxide layer thereof, a nitride layer thereof, or an oxynitride layer thereof. The lanthanum-based material may function to reduce the threshold voltage of the NMOS region. Therefore, the second work function control layer pattern 114 including the lanthanum-based material in the NMOS region may have a work function lower than that of the PMOS. For example, the work function of about 4.0 to about 4.4 eV may be provided to the NMOS region.

Due to the above-mentioned structure, the semiconductor device according to another exemplary embodiment of the present invention may have a beneficial work function, and the properties of the semiconductor device may be improved.

A method of fabricating the above-mentioned semiconductor devices will be described hereinafter. In the description of the method, processes capable of being achieved by steps of processes extensively known to those skilled in the art will be schematically described so as to prevent the present invention from being vaguely interpreted. Furthermore, the structure and the material of the semiconductor device may be identical to those of the above-mentioned semiconductor devices, thus repetition will be briefly explained or omitted.

FIGS. 3A to 3G are sectional views sequentially illustrating the fabrication of the semiconductor device of FIG. 1 according to an exemplary embodiment of the present invention.

Figure 3A:
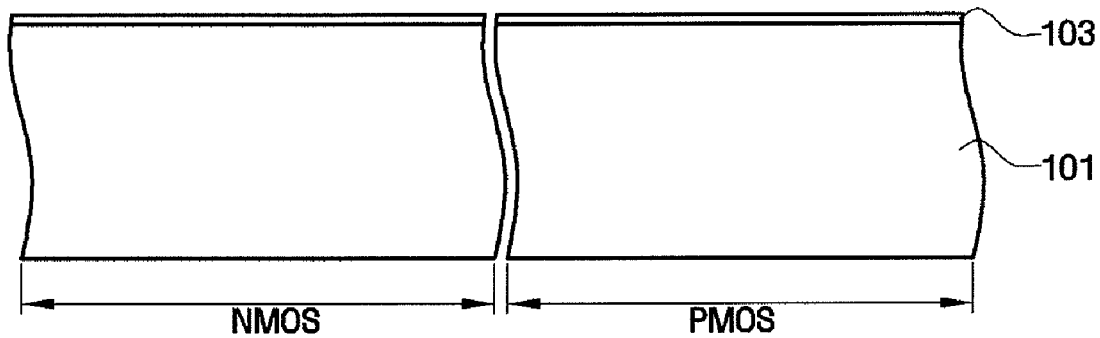
FIGS. 3A to 3G are sectional views sequentially illustrating the fabrication of the semiconductor device according an exemplary embodiment of the present invention.

With reference to FIG. 3A, a gate insulating layer 103 is formed on a semiconductor substrate 101.

The gate insulating layer 103 may be formed by, for example, heat oxidation or the deposition of the gate insulating layer material. In addition, in the case of when the gate insulating layer 103 is formed of a high dielectric layer, an interface layer may be additionally formed between the semiconductor substrate 101 and the gate insulating layer 103. The interface layer may function to prevent reaction from occurring between the high dielectric layer and the semiconductor substrate. For example, the interface layer may be formed to have the thickness of about 1.5 nanometers (nm) or less by washing the semiconductor substrate by means of ozone gas or ozone water containing ozone.

Figure 3B:
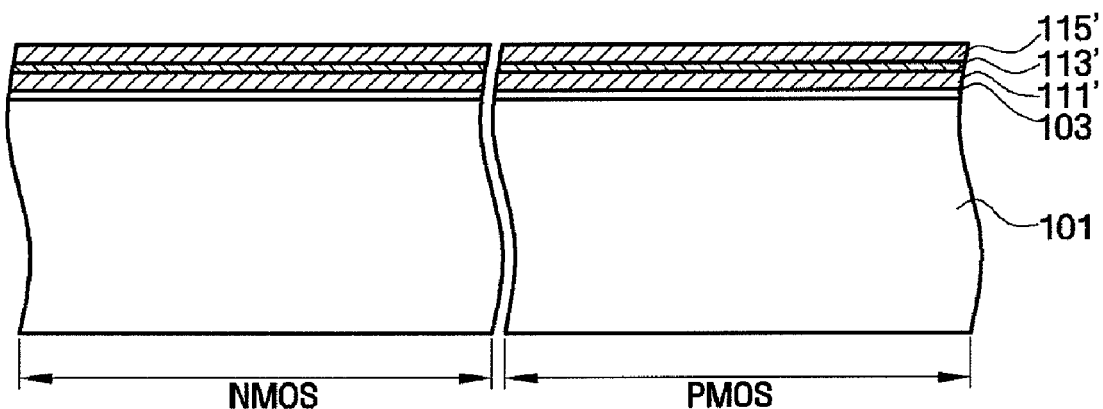

Next, as shown in FIG. 3b, a first conductive layer 111', a first work function control layer 113', and a second conductive layer 115' are formed on an entire surface of the semiconductor substrate 101 on which the gate insulating layer 103 is formed.

In connection with this, the first conductive layer 111' may have an etching selectivity that is different from those of the first work function control layer 113 and the second conductive layer 115'. For example, the second conductive layer 115' and the first work function control layer 113' may be made of the material having an etching selectivity to a hydrofluoric acid solution that is higher than that of the first conductive layer 111'. The above conditions allow for the selective removal of the first work function control layer 113' and second conductive layer 115' of the NMOS region so that only the first conductive layer 111' remains during the subsequent process.

For example, the first conductive layer 111' may be made of a material such as tantalum nitride (TaN) or titanium nitride (TiN) which may be etched with difficulty in the hydrofluoric acid solution, an aluminum oxide layer or an aluminum nitride layer may be used as the first work function control layer 113', and the second conductive layer 115' may be made of hafnium nitride (HfN).

Figure 3C:
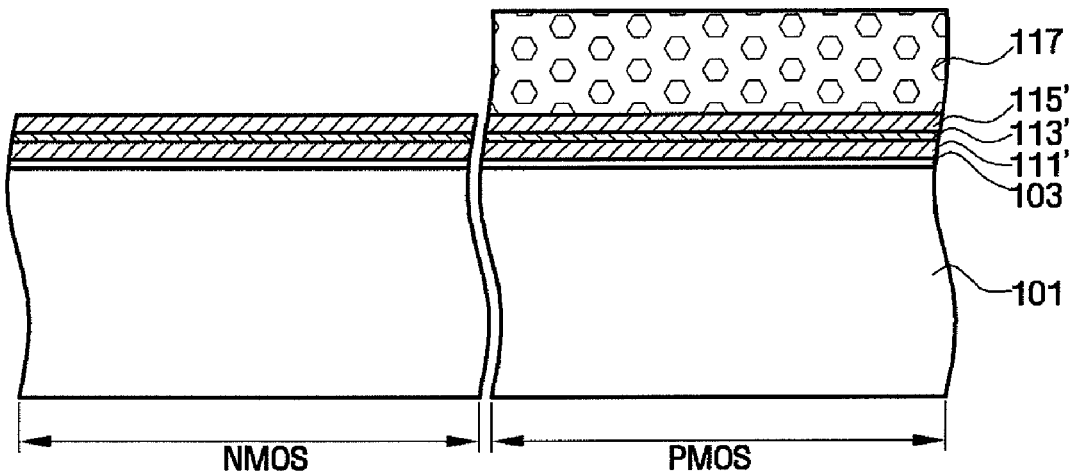

Subsequently, as shown in FIG. 3C, a photoresist pattern 117 is formed on the second conductive layer 115' of the PMOS region to expose the NMOS region. The photoresist pattern 117 may be formed using a typical process.

Figure 3D:
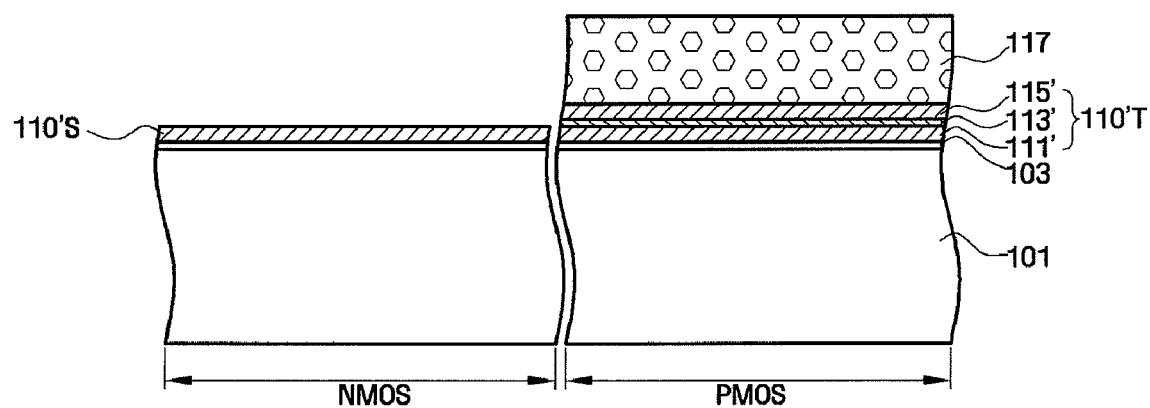

Next, as shown in FIG. 3D, the second conductive layer 115' and the first work function control layer 113' that are formed in the NMOS region are selectively removed. Thereby, a conductive single layer 110'S that is formed of only the first conductive layer remains in the NMOS region, and a three-layered conductive layer 110'T that includes the first conductive layer 111', the first work function control layer 113', and the second conductive layer 115 remains in the PMOS region.

The selective removal of the second conductive layer 115' and the first work function control layer 113' from the NMOS region may be performed using the controlling of the etching selectivity. In the case of when the second conductive layer 115' and the first work function control layer 113' have etching selectivities that are similar to each other but different from the etching selectivity of the first conductive layer, the second conductive layer and the first work function control layer may be removed by the etching process that is performed once. However, in the case of when the etching selectivities of the second conductive layer 115' and the first work function control layer 113' are different from each other, the etching processes may be separately performed. In connection with this, the etching process may be performed using, for example, wet etching or dry etching. The wet etching may be selected to minimize plasma damage.

For example, as the second conductive layer and the first work function control layer are made of material having etching selectivity to the hydrofluoric acid solution that are higher than that of the first conductive layer 111', the second conductive layer 115' and the first work function control layer 113' may be selectively removed and the first conductive layer 111' may remain. In connection with this, a substance that is used to perform the etching may have a low etching selectivity so that the photoresist pattern 117 is not etched or the photoresist pattern 117 remains until the first work function control layer 113' is removed. For example, the first conductive layer 111' is made of TaN, the first work function control layer 113' is made of aluminum oxide (AlO), the second conductive layer 115' is made of HfN, and the etching material used is the hydrofluoric acid solution.

Furthermore, during the etching process, as the gate insulating layer 103 of the NMOS region is not exposed, damage to the gate insulating layer 103 may be prevented in advance.

Figure 3E:
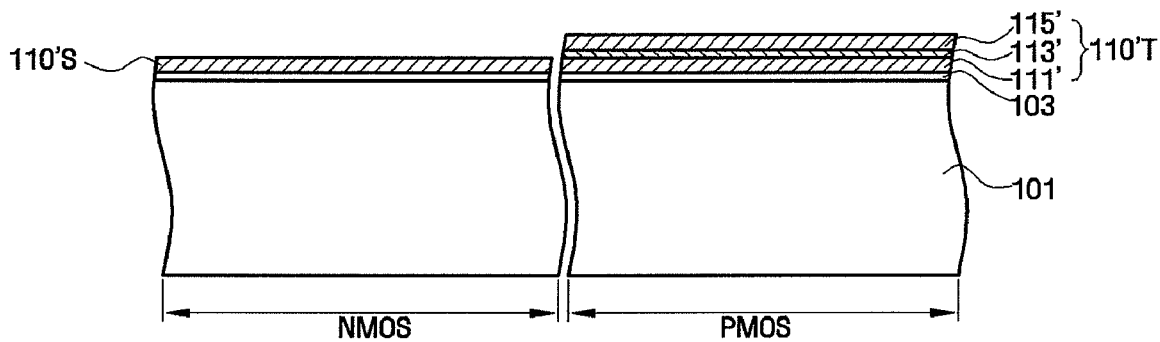

Subsequently, as shown in FIG. 3E, the photoresist pattern 117 is removed.

The removal of the photoresist pattern 117 may performed, for example, by means of an ashing process using typical oxygen gas. Furthermore, for example, gas such as hydrogen, nitrogen, ammonia, helium, and argon, not oxygen gas, may be used as the reactive gas to form plasma, and the photoresist pattern may be removed using the plasma. During the ashing process in which the oxygen gas is not used, gas containing, for example, fluorine such as carbon tetrafluoride ($CF_4$) may be additionally used to increase the removal efficiency of the photoresist pattern. During the ashing process in which the oxygen gas is not used, the thickness of the gate insulating layer 103 does not change and deterioration due to oxygen that occurs in the case of when the high dielectric layer such as the hafnium oxide layer is used is minimized. Thus, the case of when oxygen gas is not used may be more beneficial than the case of when the oxygen gas is used.

Figure 3F:
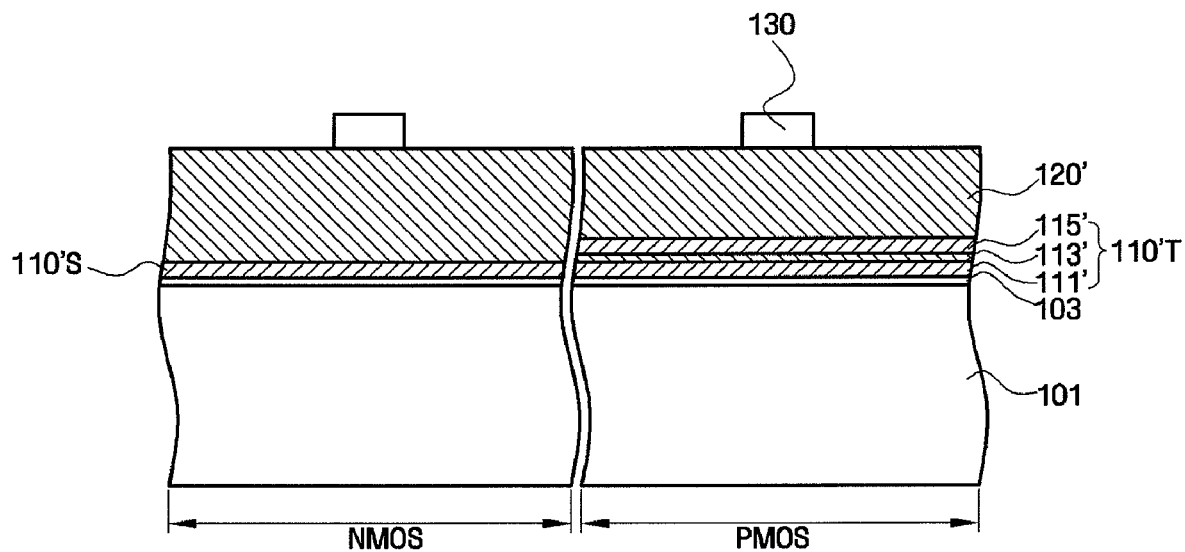

Next, as shown in FIG. 3F, a conductive layer for gate electrodes 120' is formed on an entire surface of the semiconductor substrate. Subsequently, a mask pattern 130 may be additionally formed on the conductive layer for gate electrodes 120' to pattern the gate electrode.

Figure 3G:
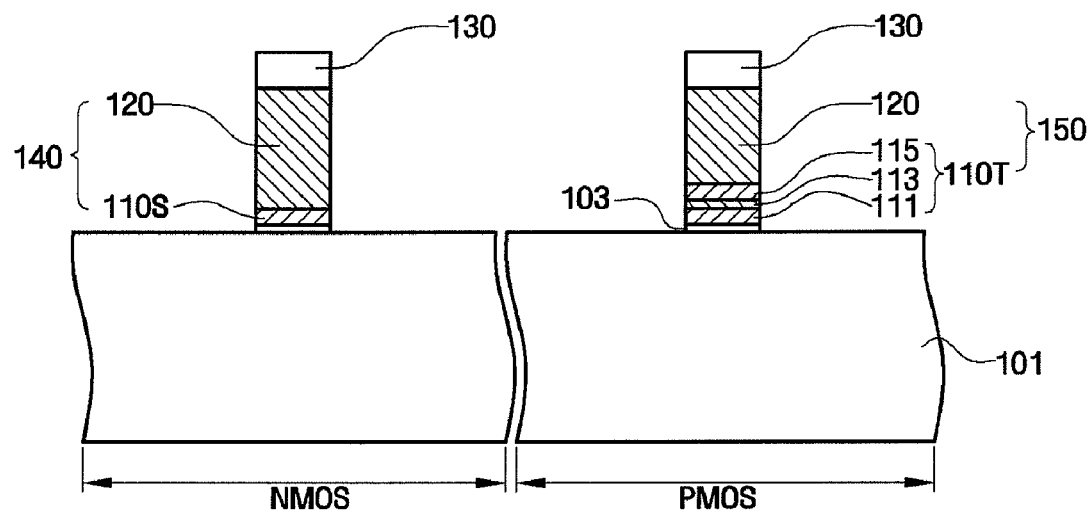

As shown in FIG. 3G, the patterning may be performed using the mask pattern 130 as an etching mask to form the NMOS gate 140 and the PMOS gate 150. As shown in the drawing, the NMOS gate 140 includes the one-layered conductive layer pattern 110S and the PMOS gate 150 includes the three-layered conductive layer pattern 110T.

The patterning process may be performed by sequentially removing the conductive layer for gate electrodes, the second conductive layer, the first work function control layer, and the first conductive layer using, for example, a typical dry etching or wet etching process.

Furthermore, for example, during the patterning process, the conductive layer for gates is etched, the exposed upper surfaces of the first conductive layer and the second conductive layer are then bombarded with elements such as oxygen or argon to amorphize the conductive single layer or the three-layered conductive layer to be removed, and the wet etching is performed to remove the conductive single layer or the three-layered conductive layer.

Subsequently, source and drain regions may be formed according to processes extensively known to those skilled in the semiconductor device field to finish the formation of the PMOS transistor and the NMOS transistor, and a step for forming the spacers may be further performed to fabricate the semiconductor device shown in FIG. 1.

Furthermore, a step of forming wires so that electric signal is inputted into and outputted from transistors, a step of forming a passivation layer on a substrate, and a step of packaging the resulting substrate may be additionally performed as the subsequent steps to finish the fabrication of the semiconductor device. The description of the subsequent steps will be omitted in order to prevent the present invention from being vaguely interpreted.

Figure 4A:
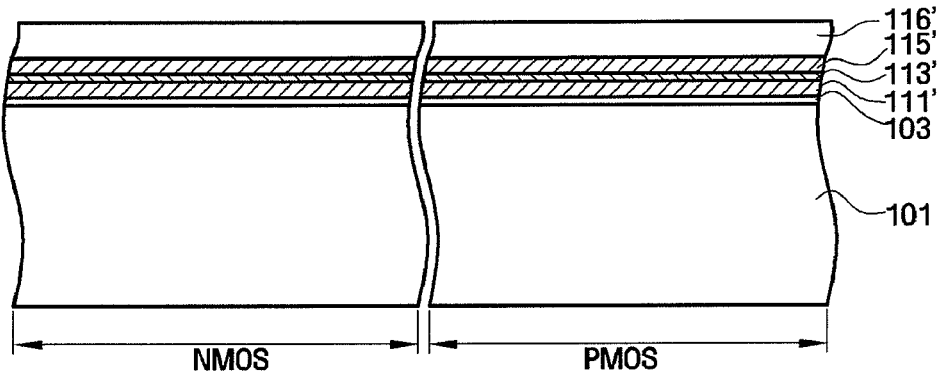
FIGS. 4A to 4C are sectional views sequentially illustrating the fabrication of the semiconductor device according to an exemplary embodiment of the present invention.
Figure 4B:
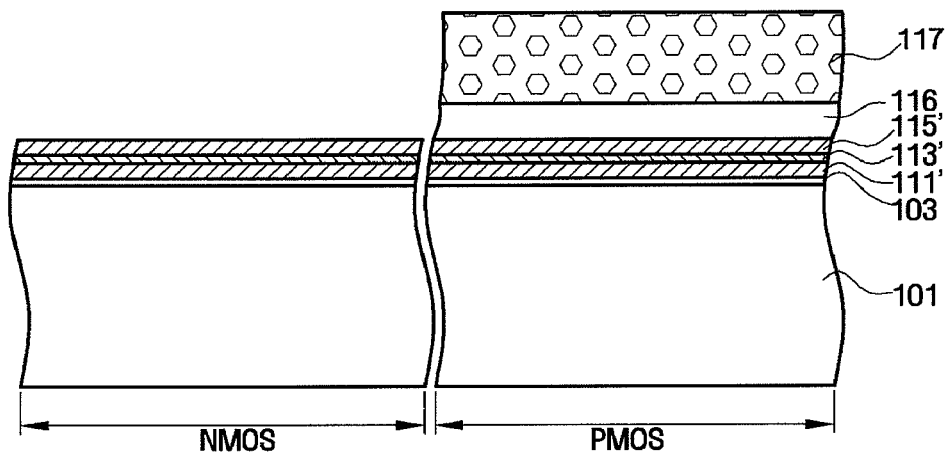
Figure 4C:
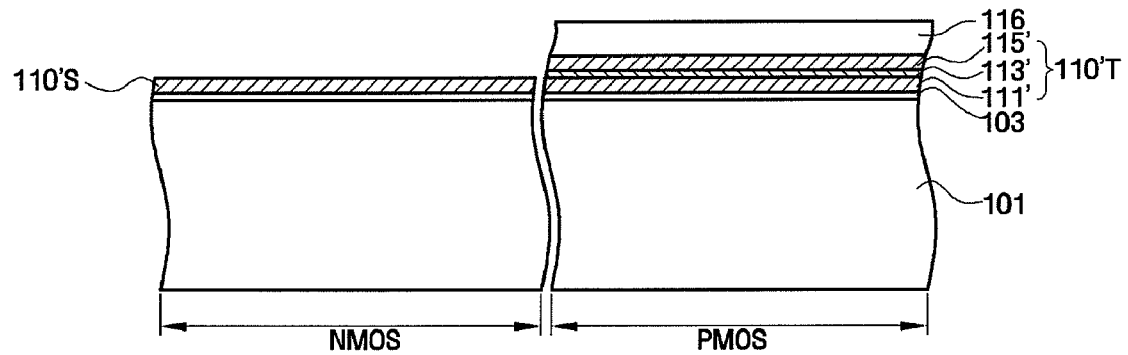

FIGS. 4A to 4C are sectional views sequentially illustrating the fabrication of the semiconductor device of FIG. 1 according to another exemplary embodiment of the present invention.

The fabrication of the semiconductor device of FIG. 1 according to another exemplary embodiment of the present invention is substantially identical to that of the embodiment of the present invention in that the first conductive layer 111', the work function control layer 113', and the second conductive layer 115' are formed on an entire surface of the semiconductor substrate 101 on which the gate insulating layer 103 is formed.

Subsequently, as shown in FIG. 4A, a hard mask layer 116' is formed on the second conductive layer 115'. Examples of a process of forming the hard mask layer 116' include, but are not limited to a low temperature deposition process such as atomic layer deposition (ALD). In the case of when the hard mask layer 116' is formed using the high temperature deposition, the gate insulating layer 103 may deteriorate due to the diffusion of the first conductive layer 111'. However, the low temperature deposition process such as the atomic layer deposition may prevent the gate insulating layer 103 from deteriorating.

The material that is capable of being applied to the hard mask layer 116' may be the substance that has predetermined etching selectivity to the work function control layer 113' and the second conductive layer 115', for example, silicon dioxide ($SiO_2$), silicon nitride (SiN), silicon oxynitride (SiON), or silicon (Si).

Selectively, annealing is performed to improve hardness of the hard mask layer 116'. In connection with this, it is preferable that the annealing temperature be about 400° C. or less to prevent the gate insulating layer 103 from deteriorating.

Subsequently, as shown in FIG. 4B, the photoresist pattern 117 is formed on the hard mask layer 116' so as to expose the NMOS region, and the hard mask layer 116' is etched using the photoresist pattern as the etching mask to form a hard mask layer pattern 116 while the NMOS region is exposed. The etching of the hard mask layer 116' may be performed by, for example, wet etching.

Next, as shown in FIG. 4C, the photoresist pattern 117 is removed. As the removal of the photoresist pattern 117 is substantially the same as the step of FIG. 3E, a detailed description thereof will be omitted. Meanwhile, in modified exemplary embodiments of the present invention, the photoresist pattern 117 may be removed after the selective removal of the second conductive layer 115' and the first work function control layer 113' described below.

Subsequently, the second conductive layer 115' and the first work function control layer 113' that are formed in the NMOS region are selectively removed using the hard mask layer pattern 116 as the etching mask. Thereby, the conductive single layer 110'S that is formed of only the first conductive layer remains in the NMOS region, and the three-layered conductive layer 110'T that includes the first conductive layer 111', the first work function control layer 113', and the second conductive layer 115' remains in the PMOS region.

The selective removal of the second conductive layer 115' and the first work function control layer 113' is almost the same as the step of FIG. 3. However, as the hard mask layer pattern 116 is used as the etching mask in the present step, in respect to the used etching material, it is necessary to consider only the etching selectivity to the hard mask layer pattern 116, but not to consider the etching selectivity to the photoresist pattern 117.

For example, in the case of when the second conductive layer 115' is made of titanium nitride (TiN), the second conductive layer has high etching selectivity to the etching solution containing ammonium hydroxide ($NH_4OH$), peroxide ($H_2O_2$), and water ($H_2O$). However, the etching solution containing $NH_4OH$, $H_2O_2$, and $H_2O$ also has the high etching selectivity to the photoresist pattern 117. Accordingly, in the case of when the photoresist pattern 117 is used as the etching mask, it may be difficult to perform desirable patterning. However, in the present step, as the hard mask layer pattern 116 is used as the etching mask, it is necessary to consider only the etching selectivity to the hard mask layer pattern 116, but not to consider the etching selectivity to the photoresist pattern 117. That is, in the case of when the hard mask layer pattern 116 is made of $SiO_2$, SiN, SiON, or Si, as the etching selectivity to the etching solution containing $NH_4OH$, $H_2O_2$, and $H_2O$ is low, it is possible to perform the desirable etching.

Once the selective removal of the second conductive layer 115' and the first work function control layer 113' is finished, the hard mask layer pattern 116 is removed by the hydrofluoric acid solution.

Subsequently, the same processes as FIGS. 3F and 3G are performed as the subsequent processes to finish the fabrication of the semiconductor device shown in FIG. 1.

Meanwhile, the fabrication of the semiconductor device shown in FIG. 2 is substantially the same as the fabrication of the semiconductor device shown in FIG. 1, except that the one-layered conductive layer pattern 110S is formed in the PMOS region and a three-layered conductive layer pattern 110T_1 that includes the second work function control layer pattern 114 having the lanthanum-based material is formed in the NMOS region. Accordingly, the fabrication of the semiconductor device shown in FIG. 2 may be readily understood by the processes of FIGS. 3A to 3G and 4A to 4C. Therefore, the detailed description thereof will be omitted to clarify the present invention.

Figure 5A:
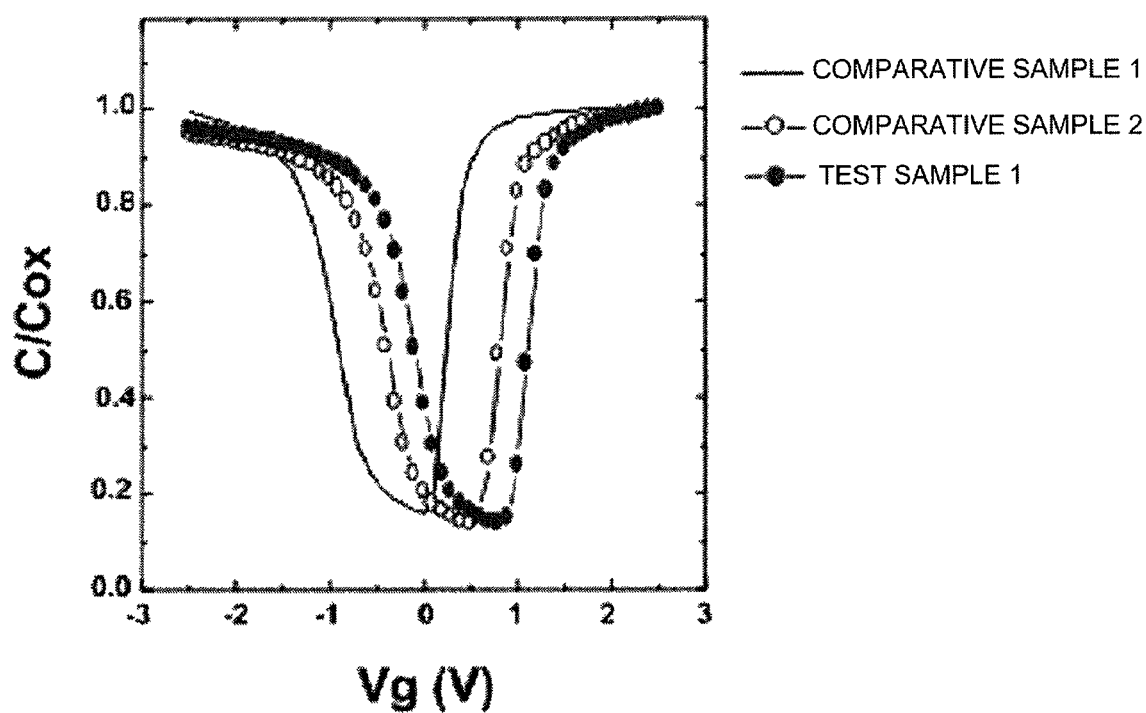
FIGS. 5A and 5B are PMOS CV graphs for test samples and comparative samples according to an exemplary embodiment of the present invention.
Figure 5B:
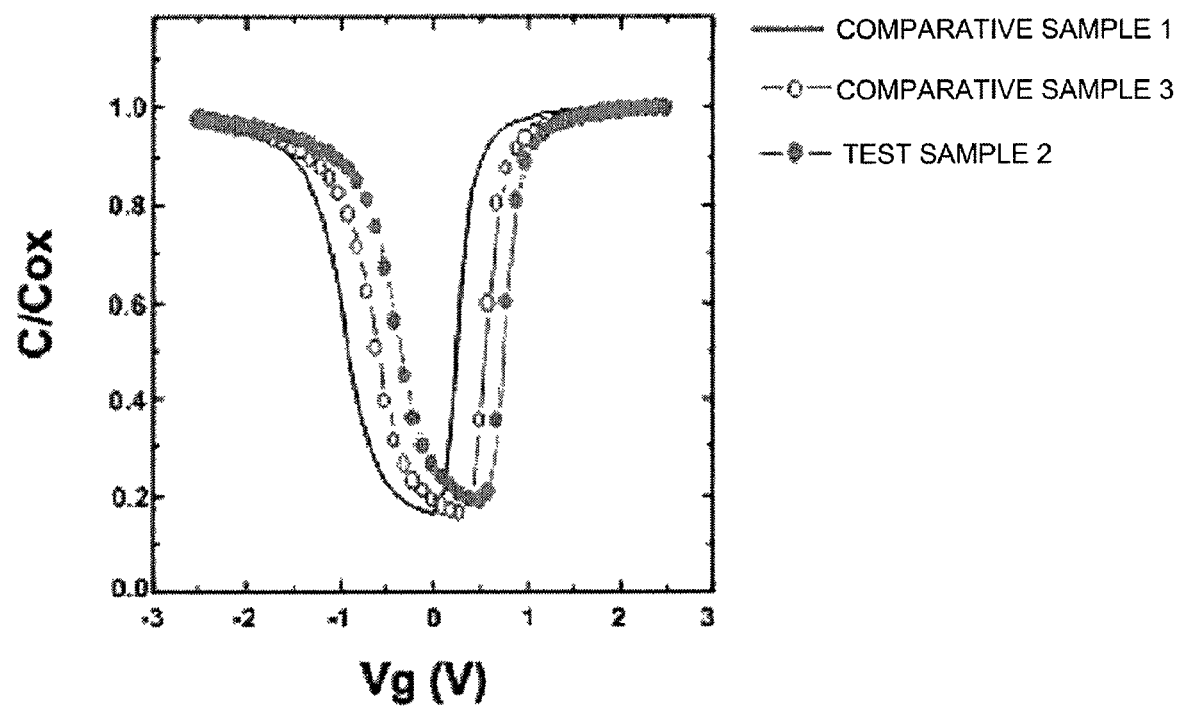

Experimental examples will be described with reference to FIGS. 5A and 5B hereinafter. FIGS. 5A and 5B are PMOS CV graphs for comparative samples and test samples.

In FIG. 5A, comparative sample 1 is a gate that is formed of a gate insulating layer and a polysilicon layer, comparative sample 2 is a gate that is formed of a gate insulating layer, TaN (40 Å), and a polysilicon layer, and test sample 1 is a gate electrode that is formed of a gate insulating layer, TaN (20 Å), aluminum nitride (AlN) (10 Å), TaN (20 Å), and a polysilicon layer.

Furthermore, in FIG. 5B, comparative sample 1 is as described above, comparative sample 3 is a gate that is formed of a gate insulating layer, TaN (40 Å), and a polysilicon layer, and test sample 2 is a gate electrode that is formed of a gate insulating layer, HfN (20 Å), AlN (10 Å), HfN (20 Å), and a polysilicon layer.

As shown in FIGS. 5A and 5B, in comparison with comparative sample 1 that includes the gate formed of only the polysilicon layer, the work function may be increased in comparative sample 2 and comparative sample 3 that include only a TaN layer or an HfN layer. However, there is a limit in an increase of the thickness in comparative sample 2 and comparative sample 3. On the other hand, in test sample 1 and test sample 2 in which the thin work function control layer made of AlN is additionally formed between the TaN layer and the HfN layer, the work function is even more increased. Accordingly, it can be seen that the work function control layer contributes to the formation of the PMOS electrode.

As described above, in the semiconductor device according to exemplary embodiments of the present invention, as the PMOS region and the NMOS region includes dual gates having a desirable work function, electric properties such as threshold voltage of the semiconductor device may be improved. Furthermore, in the method of fabricating the semiconductor device according to exemplary embodiments of the present invention, it is possible to fabricate the semiconductor device that includes the dual gates having different structures while damage to the gate insulating layer is prevented.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A semiconductor device comprising:
   a semiconductor substrate including an n-channel metal-oxide semiconductor (NMOS) region and a p-channel metal-oxide semiconductor (PMOS) region;
   a gate insulating layer formed on the semiconductor substrate;
   an n-channel metal-oxide semiconductor (NMOS) gate formed on the gate insulating layer of the NMOS region, wherein the NMOS gate consists essentially of a three-layered conductive layer pattern and a first portion of a gate electrode conductive layer pattern formed on the three-layered conductive layer pattern; and
   a p-channel metal oxide semiconductor (PMOS) gate formed on the gate insulating layer of the PMOS region, wherein the PMOS gate consists essentially of a one-layered conductive layer pattern and a second portion of the gate electrode conductive layer pattern formed on the one-layered conductive layer pattern.

2. The semiconductor device of claim 1, wherein:
   the one-layered conductive layer pattern consists essentially of a first conductive layer pattern;
   the three-layered conductive layer pattern consists essentially of the first conductive layer pattern and a second conductive layer pattern layered so that a work function control layer pattern is interposed between the first conductive layer pattern and the second conductive layer pattern.

3. The semiconductor device of claim 2, wherein the work function control layer includes a lanthanum-based material.

4. The semiconductor device of claim 3, wherein:
   the lanthanum-based material includes one of cerium (Ce), praseodymium (Pr), neodymium (Nd), gadolinium (Gd), terbium (Tb), dysprosium (Dy), erbium (Er), or europium (Eu);
   and wherein the work function control layer is formed of a metal layer including only the lanthanum-based material, an oxide layer thereof, a nitride layer thereof, or an oxynitride layer thereof.

5. The semiconductor device of claim 2, wherein the first conductive layer is made of a material having the etching selectivity that is different from the etching selectivities of the work function control layer and the second conductive layer.

6. The semiconductor device of claim 5, wherein the second conductive layer and the work function control layer each have a wet etching selectivity to a hydrofluoric acid solution that is higher than an etching selectivity of the first conductive layer.

7. The semiconductor device of claim 1, wherein the three-layered conductive layer pattern has a work function of about 4.0 to about 4.4 eV.

8. The semiconductor device of claim 1, wherein the one-layered conductive layer pattern has a work function of about 4.8 to about 5.1 eV.

9. The semiconductor device of claim 1, wherein the gate insulating layer comprises one of a silicon oxide layer or a high dielectric layer, wherein the high dielectric layer includes an oxide layer, an aluminate layer, or a silicate layer including at least one metal selected from the group consisting of hafnium (Hf), zirconium (Zr), aluminum (Al), titanium (Ti), lanthanum (La), yttrium (Y), gadolinium (Gd), and tantalum (Ta).

10. A semiconductor device comprising:
    a semiconductor substrate including an n-channel metal-oxide semiconductor (NMOS) region and a p-channel metal-oxide semiconductor (PMOS) region;
    a gate insulating layer formed on the semiconductor substrate;
    an n-channel metal-oxide semiconductor (NMOS) gate formed on the gate insulating layer of the NMOS region, wherein the NMOS gate consists essentially of a one-layered conductive layer pattern and a first portion of a gate electrode conductive layer pattern formed on the one-layered conductive layer pattern; and
    a p-channel metal oxide semiconductor (PMOS) gate formed on the gate insulating layer of the PMOS region, wherein the PMOS gate consists essentially of a three-layered conductive layer pattern and a second portion of the gate electrode conductive layer pattern formed on the three-layered conductive layer pattern.

11. The semiconductor device of claim 10, wherein:
    the one-layered conductive layer pattern consists essentially of a first conductive layer pattern; and
    the three-layered conductive layer pattern consists essentially of the first conductive layer pattern and a second conductive layer pattern layered so that a work function control layer pattern is interposed between the first conductive layer pattern and the second conductive layer pattern.

* * * * *